United States Patent
Dunne

(10) Patent No.: US 9,112,099 B2
(45) Date of Patent: Aug. 18, 2015

(54) LASER ETCHING A STACK OF THIN LAYERS FOR A CONNECTION OF A PHOTOVOLTAIC CELL

(71) Applicant: NEXCIS, Rousset Cedex (FR)

(72) Inventor: Brendan Dunne, Rousset Cedex (FR)

(73) Assignee: NEXCIS, Rousset Cedex (FR)

( * ) Notice: Subject to any disclaimer, the term of this patent is extended or adjusted under 35 U.S.C. 154(b) by 0 days.

(21) Appl. No.: 14/398,139

(22) PCT Filed: Jan. 28, 2013

(86) PCT No.: PCT/FR2013/050174
§ 371 (c)(1),
(2) Date: Oct. 31, 2014

(87) PCT Pub. No.: WO2013/164523
PCT Pub. Date: Nov. 7, 2013

(65) Prior Publication Data
US 2015/0087103 A1 Mar. 26, 2015

(30) Foreign Application Priority Data
May 3, 2012 (FR) .................................... 12 54088

(51) Int. Cl.
*H01L 21/00* (2006.01)
*H01L 31/18* (2006.01)
*H01L 31/0749* (2012.01)
*H01L 31/0463* (2014.01)
*H01L 31/042* (2014.01)

(52) U.S. Cl.
CPC ............ *H01L 31/186* (2013.01); *H01L 31/042* (2013.01); *H01L 31/0463* (2013.01); *H01L 31/0749* (2013.01); *Y02E 10/541* (2013.01)

(58) Field of Classification Search
CPC ............ H01L 31/18; H01L 31/022425; H01L 31/02168; H01L 31/0543; H01L 31/0725; H01L 31/01864; H01L 31/0201; H01L 31/022433; H01L 31/0525; H01L 31/01804; H01L 31/184; H01L 31/186; H01L 51/0036
USPC ......... 257/E21.531, E21.599; 438/12, 57, 68, 438/462
See application file for complete search history.

(56) References Cited

U.S. PATENT DOCUMENTS

| | | | |
|---|---|---|---|
| 7,718,347 B2 | 5/2010 | Borden | |
| 2010/0170558 A1 | 7/2010 | Stein | |
| 2011/0030758 A1 | 2/2011 | Kiriyama | |

FOREIGN PATENT DOCUMENTS

| | | |
|---|---|---|
| DE | 10 2009 026411 A1 | 11/2010 |
| JP | 2011-077112 A | 4/2011 |

OTHER PUBLICATIONS

International Search Report issued in International Application No. PCT/FR2013/050174, dated Apr. 3, 2013.

*Primary Examiner* — Mark A Laurenzi
(74) *Attorney, Agent, or Firm* — Pillsbury Winthrop Shaw Pittman LLP

(57) ABSTRACT

A treatment of thin layers for forming a connection of a photovoltaic cell including the thin layers, which includes a first layer, having photovoltaic properties, deposited on a second layer, and the second layer, which is a metal contact layer, deposited on a substrate, the treatment including etching, in the first layer, at least one first trench having a first width so as to expose the second layer; and etching, in the first trench, a second trench so as to expose the substrate, the second trench having a second width less than the first width.

19 Claims, 6 Drawing Sheets

Fine etching    Wide etching    Fine etching

LASER ETCHING A STACK OF THIN LAYERS FOR A CONNECTION OF A PHOTOVOLTAIC CELL

CROSS REFERENCE TO RELATED APPLICATIONS

This application is the U.S. National Stage of PCT/FR2013/050174, filed Jan. 28, 2013, which in turn claims priority to French Patent Application No. 1254088 filed May 3, 2012, the entire contents of all applications are incorporated herein by reference in their entireties.

The present invention relates to the design of photovoltaic cells, particularly for solar panels, in particular based on an active layer comprising a I-III-VI$_2$ type stoichiometry.

Such active layers with photovoltaic properties comprise in general the species copper-indium, aluminium and/or gallium-selenium and/or sulphur. The resulting material is hereafter designated "CIGS". In the cell to be connected, a thin layer of said material is generally covered with a conductive transparent layer forming a front electrode of the cell (often made of zinc oxide, ZnO) and a transparent layer (often made of cadmium sulphide, CdS) forming a buffer between the photovoltaic layer and the electrode layer.

It is described particularly in the document: "*Picosecond Laser Structuring for the Monolithic Serial Interconnection of CIS Solar Cells*" (P. Huber et al.), 24*th European Photovoltaic Solar Energy Conference*, 21-25 Sep. 2009, Hamburg, Germany a structure of solar cells comprising (as illustrated in FIG. 1 appended hereto):
- a substrate SUB, in particular made of glass;
- on which is deposited a contact layer, often made of molybdenum Mo (represented in the drawings by dots when it is shown in section);
- on which is deposited a CIGS layer with photovoltaic property (represented in the drawings by oblique hatching when it is shown in section);
- on which other layers are deposited for the complete conception of the cell, particularly cadmium sulphide CdS and zinc oxide ZnO.

In particular, to create the connections of a cell resulting from such a stacking, etching patterns P1, P2, P3, are made.

More particularly, concerning the pattern P1 represented in FIG. 1:
- the molybdenum Mo layer is etched locally; and
- the CIGS layer is then deposited on the substrate left exposed following the local etching of the molybdenum.

It will be noted more particularly that the CIGS layer must be deposited directly on the glass substrate SUB.

Yet, a technique of depositing the CIGS layer, which proves to be particularly advantageous industrially and economically, consists in the electrolysis of at least precursors of the CIGS layer (often the species I and III, the species VI being able to be supplied later during a heat treatment).

Nevertheless, this deposition by electrolysis has to be carried out on a conductive support, normally molybdenum Mo.

It will thus be understood that this conventional technique of etching according to the pattern P1 according to the prior art presented above is incompatible with deposition by electrolysis. In fact, an electrolysis directly on the substrate SUB (made of insulating glass), exposed following the etching of the molybdenum, is here impossible.

The present invention improves the situation.

It proposes to this end a method for treating thin layers, with a view to forming a photovoltaic cell connection comprising said thin layers, said thin layers comprising at least:
- a first layer, with photovoltaic properties, deposited on a second layer; and
- said second layer, a metal contact layer, deposited on a substrate.

The method comprises in particular the steps of:
- etching, in said first layer, at least one first trench having a first width so as to expose the second layer; and
- etching, in said first trench, a second trench so as to expose the substrate, the second trench having a second width less than the first width.

Thus, the method according to the invention makes it possible to deposit the first layer by electrolysis, on the contact layer and then to etch the first trench, and the second trench in the first trench (respective references L1 and L2 of FIG. 2 described in detail hereafter).

In more generic terms, in an embodiment example, the deposition of the aforementioned first layer may then comprise at least one step of deposition by electrolysis (for example of precursors of the first layer), and this possibly with a glass substrate.

In a preferential embodiment, the etching of the aforementioned second trench, at least, is carried out by laser impacts. Such an etching technique is advantageous for carrying out fine etching (for example of width comprised between 30 and 50 μm) for the second trench.

It should be pointed out that, on the other hand, the first trench (formed in the photovoltaic layer) is wider, for example of the order of 300 μm wide, and may be formed by laser impacts or simply by mechanical scribing. Such a trench 300 μm wide, makes it possible advantageously to have available a sufficient space to place insulation, interconnection, or other patterns.

It is advantageous nevertheless to carry out the two etchings (first and second trenches) during a single overall etching step, and preferentially both by laser impacts.

Thus, in one embodiment, the etching of the first and second trenches is carried out by laser impacts, during a single overall etching step.

Laser etching brings numerous advantages, particularly in terms of precision, treatment speed, with less flakes than mechanical treatment can normally generate (which also procures a space saving).

As will be seen in detail in the following description with reference to the drawings, the overall etching step may comprise:
- a fine etching operation close to side edges of the first trench, with laser impacts forming impacts partially overlapping in two surface dimensions of the first layer and/or of the second layer (as illustrated in FIG. 4*a*), and
- a rough etching operation in the middle of the first trench, with laser impacts forming impacts partially overlapping in a single surface dimension of the first layer and/or of the second layer (FIG. 4*b*), the fine etching operation extending over an overall width comprised between 20 and 40% of the width of the first trench, for example 10 to 20% on the left and 10 to 20% on the right in the first trench.

Thus, if for example the width L1 of the first trench is 300 μm, the fine etching operation may be applied:
- over a width of the first trench of 30 to 50 μm for example, counted from its left side edge towards its middle, and
- over a width of the first trench of 30 to 50 μm for example, counted from its right side edge towards its middle.

The fine etching operation at least is advantageously carried out using a Gaussian beam laser for example of diameter comprised between 30 and 50 μm.

According to tests having given satisfactory results, the fine etching operation at least is carried out using a femtosecond laser of wavelength comprised between 400 and 600 nm.

The rough etching operation may be carried out using a wider laser beam, for example elliptical and of width corresponding to the width of the first trench.

Furthermore, the second trench at least is preferentially formed using a Gaussian beam laser for example of diameter comprised between 30 and 50 µm if the second trench is of width comprised typically between 30 and 100 µm.

The second trench at least may be formed using a femtosecond laser of wavelength comprised between 1000 and 1200 nm.

As will be seen in the embodiment examples presented hereafter, the laser impacts may be of fluence comprised between 0.2 and 0.5 J/cm$^2$, and may deposit a quantity of energy per impact comprised between 0.15 J/mm$^2$ and 0.3 J/mm$^2$.

A femtosecond laser may be used for etching the aforementioned first and second trenches, as described above, in particular to take care of the state of the fronts delimiting the first trench. Nevertheless, an embodiment variant represented in FIG. 6 described in detail hereafter makes it possible to use a nanosecond laser for etching the first and second trenches (of widths L1 and L2 in FIG. 6). On the other hand, this embodiment provides for etching a third trench (reference T3 of FIG. 6) to expose the first layer (photovoltaic) and it is preferable that said third etching is carried out with a femtosecond laser. Thus, in such an embodiment, the first layer (photovoltaic) being coated with at least one third layer, generally transparent, the method further comprises an etching of the aforementioned third trench in the third layer so as to expose the first layer, and preferentially:

the etching of the third trench is carried out using a femtosecond laser, whereas the etching of the first and second trenches is carried out using a nanosecond laser.

Generally speaking, the first aforementioned layer, with photovoltaic properties, is, in one embodiment, based on a material of I-III-VI$_2$ stoichiometry, for example based on an alloy of copper-indium, gallium and/or aluminium-selenium and/or sulphur.

It has then been observed that a femtosecond laser lends itself advantageously to the dry etching (by ablation) of such a material, while having particularly neat and clearly delimited etching fronts.

Moreover, the first layer may be coated with at least one third transparent layer (for example a ZnO front electrode layer and/or at least one CdS transparent buffer layer). The etching step is advantageous in that the aforementioned first trench, at least, is formed both in the first and the third layer. To this end, a femtosecond laser may again be provided.

In this respect, it will be understood that the use of a femtosecond laser for etching a layer of stoichiometry, optionally coated with one or more transparent layers, is advantageous in itself and could be subject to a separate protection.

Furthermore, from the moment that the etching pattern, for a connection between photovoltaic cells, corresponding to a "fine" trench L2 in a "large" trench L1, is advantageous compared to the pattern "P1" of the prior art presented here above with reference to FIG. 1, the present invention also relates to a photovoltaic cell comprising such a connection pattern, and more particularly:

at least one first layer, with photovoltaic properties, deposited on a second layer, and the second layer, a metal contact layer, deposited on a substrate.

The cell comprises a connection pattern comprising in particular:

a first trench of first width etched in the first layer with exposure of the second layer; and a second trench etched in the first trench, with exposure of the substrate, the second trench having a second width less than the first width.

For example, the first trench may be of width comprised between 200 and 500 µm and the second trench may be of width comprised between 30 and 100 µm.

Other advantages and characteristics of the invention will become clear on reading the description detailed hereafter of embodiment examples and by examining the appended drawings in which:

FIG. 1 illustrates an etching pattern (P1) according to the prior art,

FIG. 2 illustrates an etching pattern for an inter-cell connection according to the invention with two trenches of respective widths L1 and L2, FIG. 3 illustrates an example of possible shape of laser beams for the implementation of the etching according to the invention, FIG. 4a illustrates the impacts of laser impacts close to the fronts of trench FR1 and FR2 of the first trench, and FIG. 4b illustrates the impacts of laser impacts rather in the middle of the first trench (at a distance from the fronts FR1 and FR2) according to a first embodiment of the invention, FIGS. 5a and 5b illustrate two successive operations of an overall etching step, in a possible embodiment of the invention, FIG. 6 illustrates the successive operations of etching, then connection, in an embodiment variant;

Figure 1:
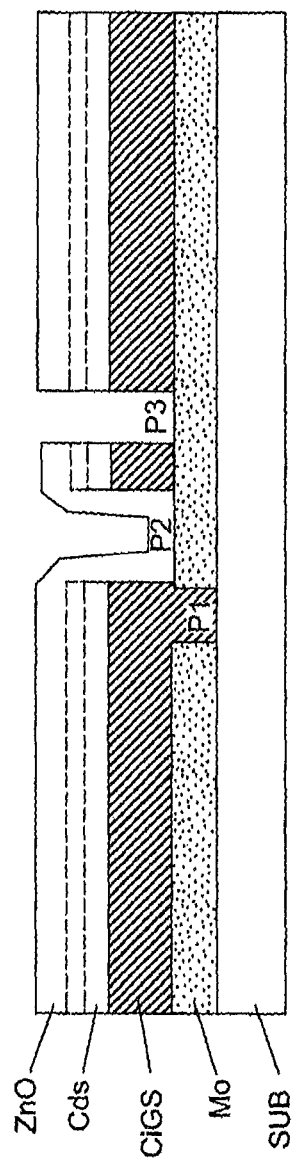

The invention proposes, with a view to preparing a connection between two photovoltaic cells, another type of etching pattern than the pattern P1 presented above with reference to FIG. 1 of the prior art.

Figure 2:
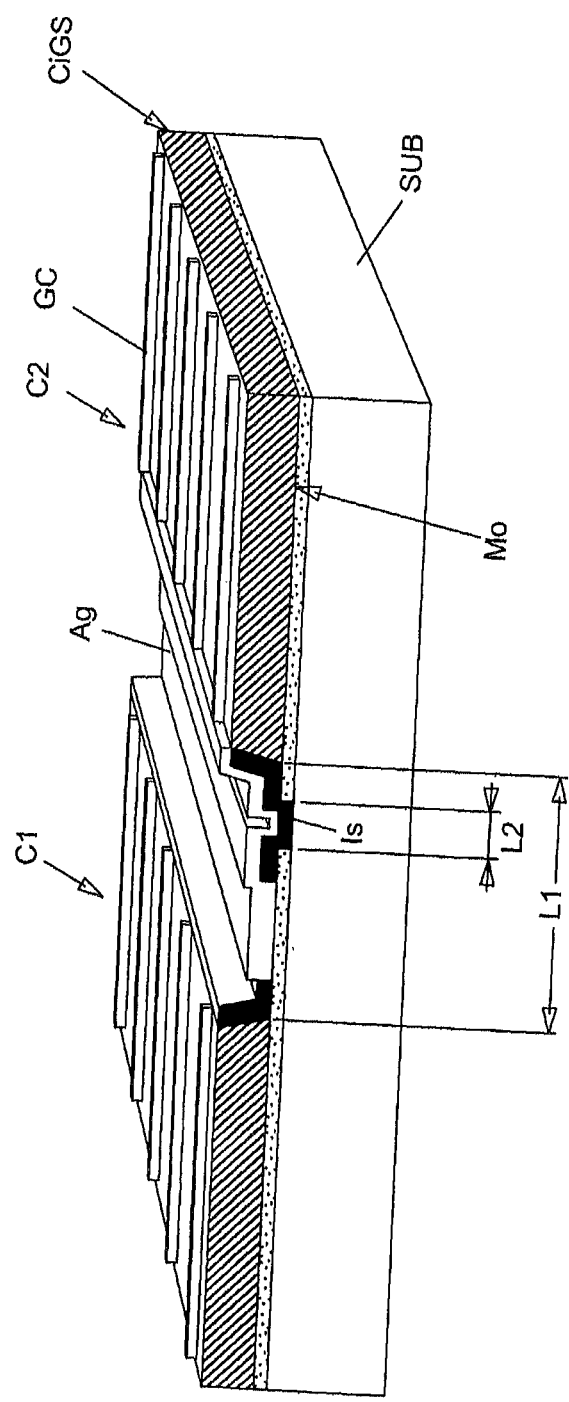

As an example, a different pattern is presented in FIG. 2 and comprises;

an etching of the CIGS layer over an entire width L1, as well as an etching of the underlying metal layer (for example molybdenum) Mo, having a lesser width L2, and formed in the trench resulting from the etching of the CIGS layer.

The etching of width L2 in the Mo contact layer makes it possible to electrically separate the photovoltaic cells from each other (C1 and C2 as represented in FIG. 2). An Ag conductive film (often made of silver) is then applied to electrically connect a collector grid GC arranged on the CIGS layer of the cell C2 to the underlying Mo contact layer of the CIGS layer of the adjacent cell C1. The reference Is of FIG. 2 designates an insulating film (in black in the representation thereof in section in FIG. 2), to assure an electrical separation of the CIGS layer of the cell C2 with the Mo contact layer of the cell C1.

In a particularly advantageous manner, the trenches of respective widths L1 and L2 are formed by laser etching. This embodiment makes it possible, as will be seen hereafter, to form the two trenches simultaneously or at least immediately one after the other.

Figure 3:
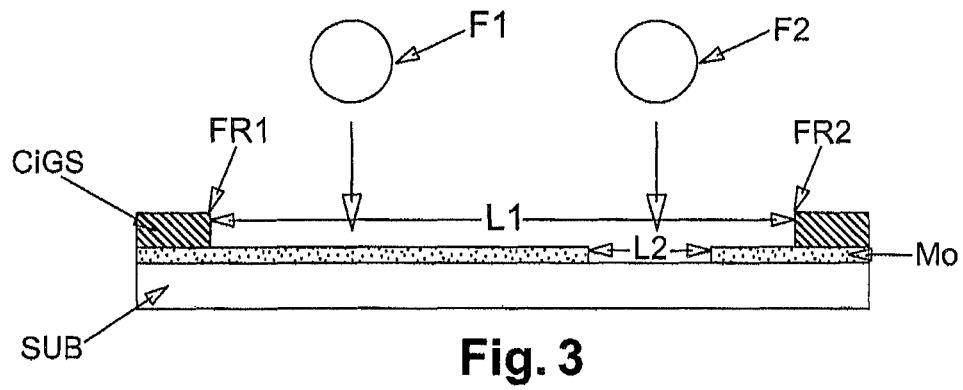

Referring now to FIG. 3, a first beam F1 carries out the laser etching to form the trench of width L1 (in the CIGS layer), whereas a second laser beam F2 carries out the laser etching to form the trench of width L2 in the Mo contact layer.

Obviously, this is an embodiment example. In a variant, it is possible to provide a single beam scanning the entire surface of the trench of width L1, then to apply this beam to the Mo contact layer to form the trench of width L2.

Figure 4A:
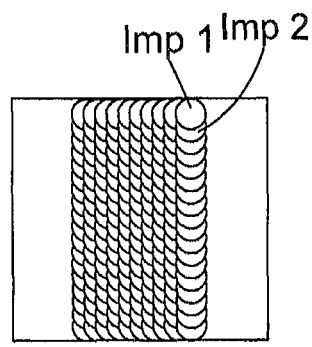
Figure 4B:
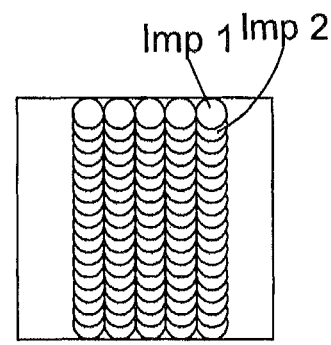

It is advisable to provide several successive laser impacts on the surface to be etched and, as illustrated in FIG. 4b, to provide in particular impacts of laser impacts Imp1 and Imp2 that partially overlap, at least in length.

More particularly, the tests carried out show that it is preferable to provide, close to the fronts FR1 (on the left of the trench of width L1 in FIG. 3) and FR2 (on the right of the trench of width L1 in FIG. 3), laser impacts forming impacts, Imp1 and Imp2 that overlap both in length and in width, as illustrated in FIG. 4a. In particular to carry out the etching of the trench delimited by the fronts FR1 and FR2 of the CIGS layer, it has been observed that the electrical characteristics of the two cells thereby connected were improved according to an impact pattern complying with FIG. 4a applied near to the fronts FR1 and FR2. These better performances can be explained by stiffer fronts of the CIGS layer, and clearly delimited, when the pattern of impacts complies with FIG. 4a.

On the other hand, far from these fronts FR1, FR2, and to form the trench of width L1, a pattern of impacts according to FIG. 4b (with a simple overlap of the impacts in the direction of the length) may be applied to accelerate the laser etching treatment of the CIGS layer.

In an embodiment example, the rate of laser impacts may be comprised between 100 kHz and 300 kHz to obtain satisfactory electrical characteristics. Furthermore, it is pointed out that the width L1 may be 300 μm (or more generally comprised between 200 and 500 μm) and that the width L2 is 50 μm (or more generally comprised between 30 and 100 μm), for a length of 600 millimeters.

Preferentially, the laser used has a very short pulse width, of picosecond type (emitting for example in the ultraviolet), or even preferentially a femtosecond pulse laser (being able to emit in the near infrared or the visible).

It is what is known as a "dry" etching, by laser ablation.

The wavelength used for the etching of the contact layer may be situated in a range comprised between 1000 and 1200 nm, for example 1030 nm. The wavelength used for the etching of the CIGS layer may be situated in a wavelength range comprised between 400 and 600 nm, for example 515 nm. Nevertheless, tests carried out with a wavelength comprised in a range between 1000 and 1200 nm (for example 1030 nm) have also given satisfactory results for the etching of the CIGS layer.

Figure 5A:
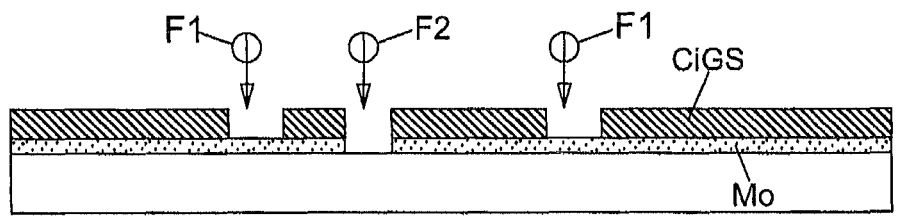
Figure 5B:
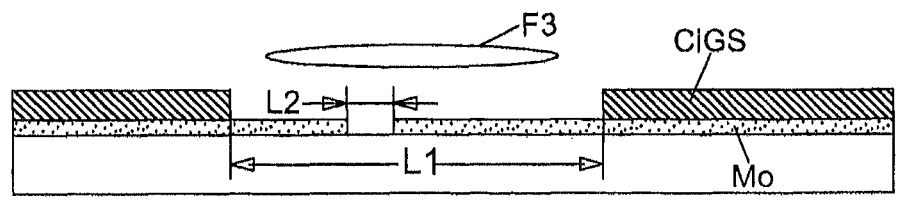

Reference will now be made to FIGS. 5a and 5b to describe an example of embodiment of the etching of two trenches of respective widths L1 and L2. With reference to FIG. 5a, it is possible to provide three laser beams as follows:
- a first beam F1, for example of 515 nm wavelength, is applied to the edges of the trench (close to the fronts FR1 and FR2 provided, represented in FIG. 3); and
- a beam F2, of 1030 nm wavelength for example, for etching the CIGS layer, then the Mo contact layer.

The beam F1 is a Gaussian beam of 30 to 50 μm diameter (focused beam) for example. It is applied with an impact frequency of 100 kHz to produce impacts as illustrated in FIG. 4a (with an overlap both in the direction of the length and in the direction of the width). The two beams F1 represented in FIG. 5a may be activated together, in tandem, and may be derived from a common laser source to which an optical separation is applied (for example with a semi-reflective blade). The quantity of energy deposited, according to the tests carried out, as well as the fluence (in J/cm$^2$), are given in the table shown below, according to tests carried out for different compositions of the CIGS layer and for different types of substrates SUB.

| CIGS layer | Wavelength | Fluence | Quantity of energy deposited |
|---|---|---|---|
| CuInS$_2$ on glass substrate | 515 nm<br>1030 nm | 0.42 J/cm$^2$<br>0.30 J/cm$^2$ | 0.18 J/mm$^2$<br>0.29 J/mm$^2$ |
| CuInS$_2$ on metal substrate | 515 nm<br>1030 nm | 0.22 J/cm$^2$<br>0.35 J/cm$^2$ | 0.23 J/mm$^2$<br>0.26 J/mm$^2$ |
| Cu—(In,Ga)—Se$_2$ on glass substrate | 515 nm<br>1030 nm | 0.29 J/cm$^2$<br>0.41 J/cm$^2$ | 0.29 J/mm$^2$<br>0.23 J/mm$^2$ |

A line is thus etched in the CIGS layer having a width of 30 to 50 μm, by applications (simultaneous or immediately successive) of beams F1 on the CIGS layer. The second beam F2 is also applied firstly to the CIGS layer, then to the Mo contact layer, to form the second trench of width L2. The diameter of the beam F2 (for example Gaussian) is 30 to 50 μm (focused beam). It is possible to provide pulse impacts (at a rate of 100 KHz) forming impacts complying with FIG. 4b with an overlap of the impacts only in the direction of the length) and does so not just for the CIGS layer but also the underlying contact layer, from the moment that these impacts are carried out at a distance from the fronts FR1 and FR2.

The energy per pulse of the impacts may be of the order of 20 μJ.

It will be noted that it is possible to carry out the etching by the beams F1 simultaneously (for example using two laser sources), but also that it is possible to carry out the etching using the beam F2, simultaneously with the etching of the beams F1.

It is indicated that in a variant of using separate laser sources, it is possible to use a single laser source split into several beams for example parallel (using a beam splitter such as a "semi-reflective blade" for example).

Then, the etching method may comprise the application of a wide beam F3, (an ellipsoidal beam), of 515 nm or 1030 nm wavelength, of width close to 300 μm, to cover the whole width L1. The impact frequencies may be according to the pattern represented in FIG. 4b (with an overlap only in the direction of the length of the impacts). In fact, it has been observed that only the CIGS etching CLOSE to the fronts FR1 and FR2 was particularly critical to obtain satisfactory electrical characteristics. On the other hand, the etching in the vicinity of the middle of the trench L1 is less critical, even if it has to be carried out so as to evacuate the CIGS and optionally other underlying layers (particularly a layer of MoSe$_2$ which can form spontaneously in certain conditions of producing the CIGS layer), while leaving a satisfactory surface state of the Mo layer.

Thus, for the etching represented in FIG. 5b, it is possible to save etching time, compared to the use of a Gaussian beam with several passages in the width of the trench.

The method can then continue by the addition of an insulator Is deposited particularly in the trench of width L2 as represented in FIG. 2, than an Ag contact (for example made of silver) deposited above the insulator, in the trench of width L1.

Figure 6:
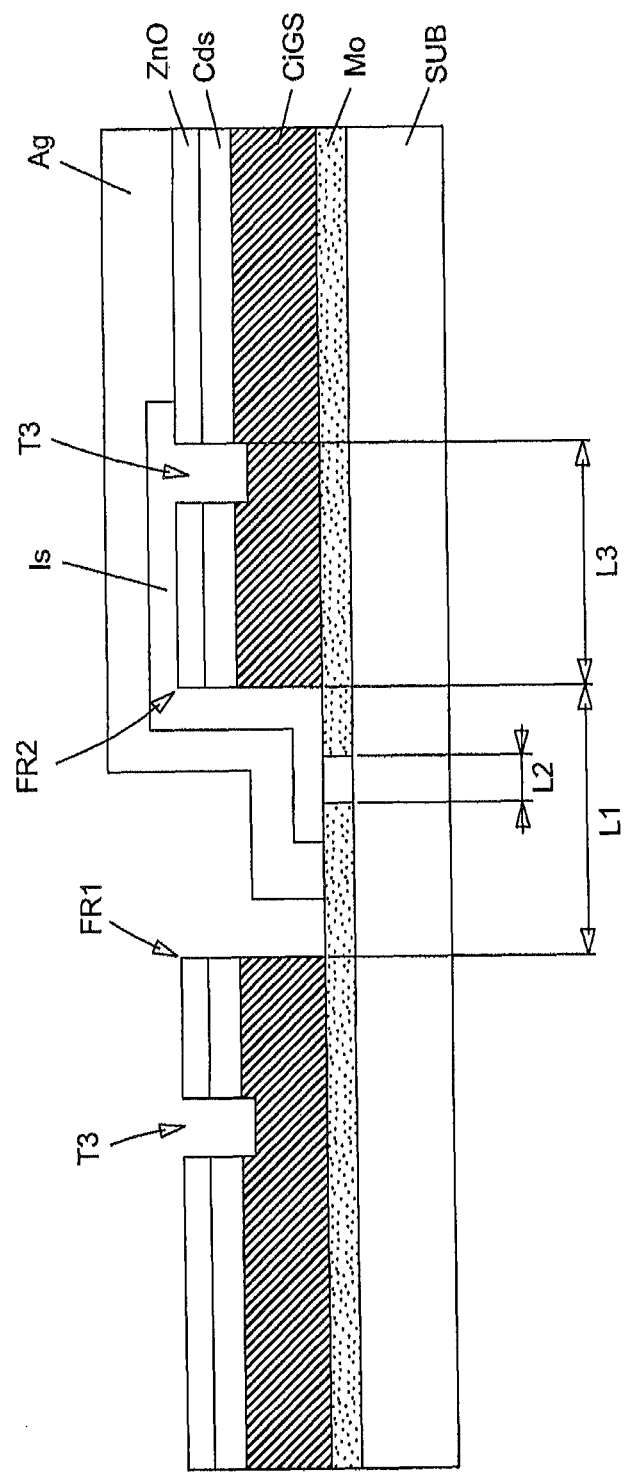

Obviously, the photovoltaic CIGS layer is normally itself coated with other layers, transparent, particularly with a conductive transparent layer often of zinc oxide ZnO to form a front face electrode of the photovoltaic cell, as well as another transparent layer of cadmium sulphide CdS, which serves for its part to form a p-n junction at the interface with the photovoltaic layer. These layers are represented in FIG. 6 commented in detail hereafter. Thus, the etching of the aforementioned first and second trenches has the effect of removing, with the photovoltaic layer, these transparent layers ZnO and CdS, to leave exposed the layer of molybdenum Mo in the first trench, or even the substrate SUB in the second trench.

It should be noted that the conventional prior art for the etching of the CIGS layer consisted until then in using a needle to remove the material in a groove between two cells. This method is nevertheless not well suited for forming the second finer trench L2 in the contact layer. Moreover, such a mechanical method of the prior art generates flakes, particularly for the etching of the trench of width L1, as explained above.

Reference will now be made to FIG. 6 to describe a method according to an embodiment variant of the invention. FIG. 6 shows in particular a third trench T3 formed in the transparent layers ZnO, CdS and the photovoltaic CIGS layer is only partially etched, to proceed more quickly in the formation of the connection while efficiently insulating the cell. Here, due to the creation of this third trench T3, the etching of the first trench does not need to be fine and precise close to the fronts FR1 and FR2 and it may be carried out using a nanosecond laser. The same is true for the second trench of width L2. On the other hand, it is preferable that the etching of the third trench T3 is carried out with a shorter pulse laser, typically with a femtosecond laser, to take care of this etching. This embodiment thus provides for a "sacrificial" zone of photovoltaic material between the trench T3 and the closest front FR2 of the first trench. This zone is preferably of width less than or equal to 50 μm.

Obviously, the present invention is not limited to the embodiments described above as illustrative examples; it extends to other variants.

Thus, it will be understood that it is possible to use a single wavelength to carry out laser impacts in the CIGS layer and in the Mo contact layer. Moreover, a single beam may be used and several passages may be carried out in the width L1 of the trench formed in the CIGS layer.

Moreover, several types of lasers (particularly of femtosecond, or even picosecond, type) enable good results to be obtained with regard to electrical characteristics measured on the connection of cells, with in particular fluences ranging from 0.2 J/cm$^2$, up to 0.5 J/cm$^2$ and quantities of energy deposited ranging from 0.15 J/mm$^2$ up to 0.3 J/mm$^2$.

Within the context of the tests described above, the thickness of the CIGS layer was comprised between 1.5 and 2.5 μm (for example 2 μm) and the thickness of the contact layer was Comprised between 0.4 and 0.8 μm (for example 0.6 μm). Nevertheless, other thickness ranges may also be envisaged).

It should also be noted that the method according to the invention described herein applies not just to glass substrates but also substrates of other types (made of steel for example, with optionally an insulator between the substrate and the molybdenum layer), as illustrated for example by the table presented above. In fact, molybdenum is a satisfactory electrically conductive material particularly for deposition by electrolysis. Thus, whether the substrate is made of glass or metal, it is preferable that the electrolysis is carried out on molybdenum. Thus a method according to the invention is used to resolve the problem posed by the etching pattern P1 of the prior art (FIG. 1), with a substrate made of glass or indiscriminately made of metal.

More generally, an example of embodiment with a layer with photovoltaic properties, formed of CIGS, has been described above. Nevertheless, other types of photovoltaic layers, for example based on kesterite, cadmium telluride, or others, may be treated according to a method similar to that described above.

Figure 7:
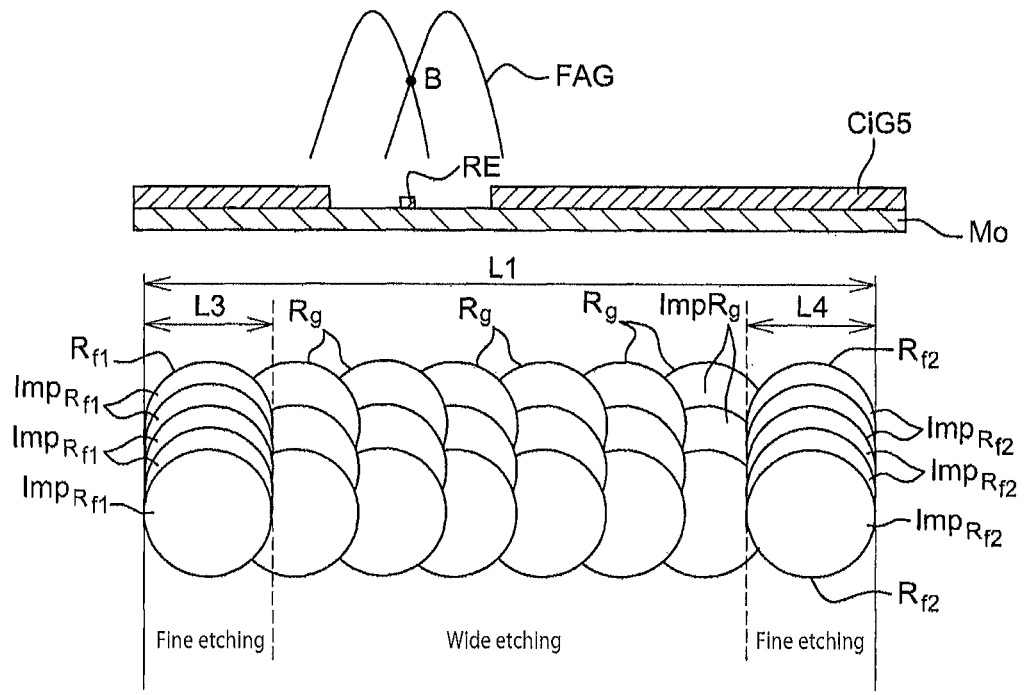
FIG. 7 illustrates the impacts of laser impacts according to a second embodiment of the invention.

FIG. 7 illustrates the impacts of laser impacts according to a second embodiment which constitutes an alternative to the embodiment described with reference to FIGS. 4a and 4b.

According to this second embodiment, the method according to the invention still comprises a fine etching operation close to the side edges of the first trench (the two edges are illustrated schematically by two lines FR1 and FR2) and a rough etching operation in the middle of the first trench. The two lines FR1 and FR2 are substantially parallel and directed along the length perpendicular to the width L1 of the trench.

The fine etching operation is preferentially carried out using a femtosecond laser with substantially circular beam, the wavelength of which is comprised between 400 and 600 nm.

Unlike the case of FIG. 4a where the fine etching took place along several rows of impacts of laser impacts arranged successively in the direction of the width of the trench, here a fine etching is carried out with a single row to carry out the etching respectively close to each of the fronts FR1 and FR2 (row Rf1 on the side of the front FR1 and row Rf2 on the side of the front FR2). Each of the rows Rf1 and Rf2 comprises respectively a succession of impacts (respectively ImpRf1 and ImpRf2) arranged and partially overlapping along the length. Two successive impacts overlap substantially according to 90 to 950 of the total surface of the impact.

It will be noted that this single row is preferentially obtained by making several laser etching passes so as to progressively hollow out the row: in other words, several series of laser impacts are going to be carried out (each series having the same positions of impacts of impacts ImpRf1 and ImpRf2) to remove progressively the material (i.e. several hundreds of nanometers per pass). This removal of material in several passes makes it possible to minimise the thermal effect on the CIGS diode.

The fine etching operation extends over an overall width comprised between 5 and 20% of the width of the first trench, for example 10 to 20% on the left and 10 to 20% on the right in the first trench.

The width L1 of the trench is for example 400 μm, the fine etching operation then being applied:
over a width L3 of the trench of 20 to 30 μm for example, counted from its left side edge FR1 towards its middle, and
over a width L4 of the trench of 20 to 30 μm for example, counted from its right side edge FR2 towards its middle.

The rough etching operation is preferentially carried out using a higher energy laser than the laser used for the fine etching: it may be a pica- or nanosecond laser. The beam of this laser is here substantially circular but it will be seen later that it is possible to use another shape (elliptical for example) for the beam. Even if the beams used respectively for the fine etching and the rough etching have in the case of FIG. 7 the same diameter, it may prove to be useful to use a larger diameter beam in the case of the rough etching.

The rough etching is here carried out with a plurality of rows Rg to form the trench of overall width L1 between the edges FR1 and FR2. Each of the rows Rg comprises respectively a succession of impacts (cf. for example the impacts ImpRg of the final row Rg before the row Rf2) arranged and partially overlapping both along the length and along the width. Two successive impacts of a same row Rg overlap substantially according to 50 to 70% of the total surface of the impact: it should be noted here that this overlap along the length is less than the overlap used during the fine etching operation.

According to the embodiment of FIG. 7, two successive impacts along the direction of the width (i.e. two opposite impacts belonging to two successive rows Rg) overlap substantially according to 20 to 30% of the total surface of the impact. It will be noted that this overlap also applies between two opposite impacts belonging respectively to a row Rf1 or Rf2 and the row Rg that follows or that precedes. According to this embodiment, the energy FAG of the beam here has a Gaussian shape (along the direction parallel to the width L1 of the trench) such that the energy at the edge B of the beam is not sufficient to completely remove the CIGS. Nevertheless, in so far as the aim of the removal of the CIGS in this trench is to expose the Mo area to deposit thereon an electrical contact, the few residues RE that may be left between the totally etched spaces are not bothersome (at least up to a certain level, corresponding to the overlap bracket of 20 to 30% mentioned above).

Figure 8:
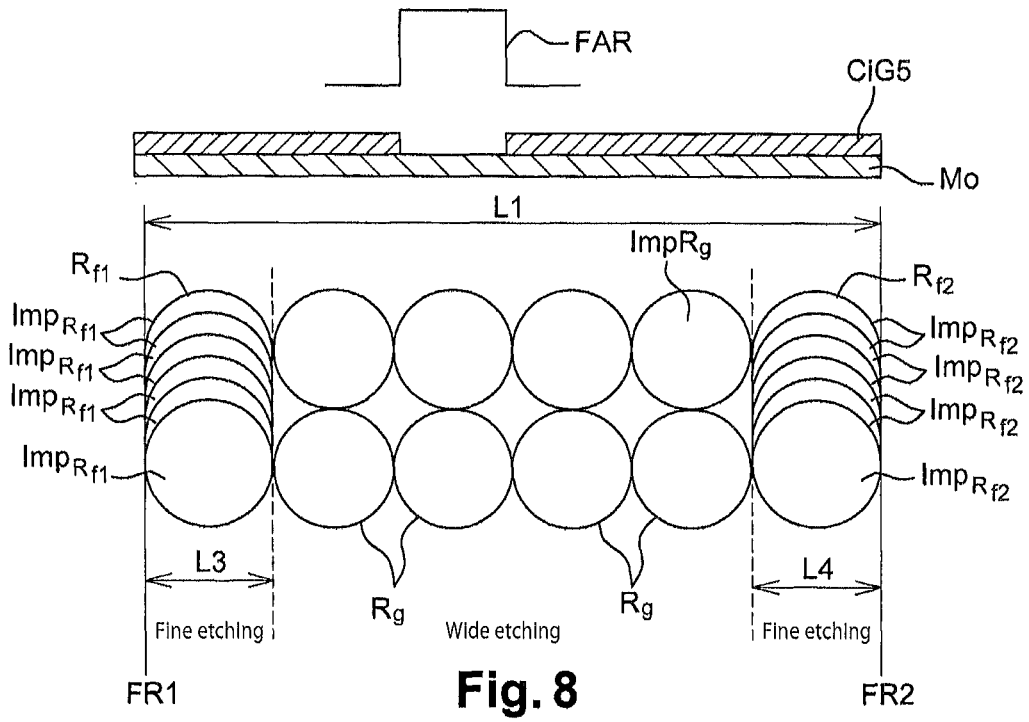
FIG. 8 illustrates the impacts of laser impacts according to a third embodiment of the invention.

According to an alternative represented in FIG. 8, two successive impacts of a same row Rg do not overlap; in the same way, two opposite impacts belonging respectively to a row Rf1 or Rf2 and the row Rg that follows or that precedes do not overlap. Unlike the case of FIG. 7, for FIG. 8, the beam is modified to take a non-Gaussian energy distribution FAR and having a more rectangular shape (also designated "top-hat"). In this case, there is no drop in energy at the edge of the beam and thus less non-etched residue. The other characteristics are identical to those of FIG. 7.

Preferentially, by using a higher energy laser for the rough etching, the rows Rg may be formed in a single laser etching pass. "A single pass" is taken to mean the fact that the beam of the laser used for the rough etching has sufficient energy to remove the material required to form the trench in a single pass at the level of each impact ImpRg.

Figure 9:
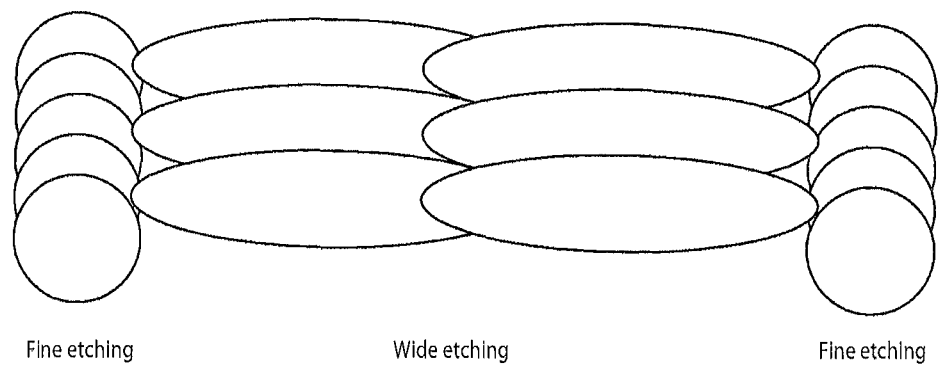
FIG. 9 illustrates the impacts of laser impacts according to a fourth embodiment of the invention.

According to an alternative illustrated in FIG. 9, the method according to the invention uses two different beam sizes to respectively carry out the fine and rough etchings. In the case in point, the beam used for the fine etching is circular and the beam used for the rough etching is elliptical. In this case, the rough etching operation is carried out using a wider laser beam than the beam used for the fine etching (i.e. the large radius of the ellipse corresponding to the beam of the rough etching is greater than the radius of the circle of the beam used for the fine etching). Obviously, the large radius of the ellipse is oriented in the direction of the width of the trench. It will also be noted that it is also possible to use a circular beam for the rough etching having a larger radius than the circular beam of the fine etching. The use of a wider beam makes it possible to form the trench more rapidly. To this end, the use of a picosecond laser to carry out the rough etching makes it possible to obtain more power and thus to make wider beams.

The invention claimed is:

1. A method of treating thin layers for forming a connection of a photovoltaic cell comprising said thin layers, said thin layers comprising:
    a first layer, with photovoltaic properties, deposited on a second layer, and
    said second layer, which is a metal contact layer, deposited on a substrate, the method comprising:
        etching, in said first layer, at least one first trench having a first width so as to expose the second layer; and
        etching, in said first trench, a second trench so as to expose the substrate, the second trench having a second width less than the first width,
    the etching of the first and second trenches being carried out by laser impacts, during a single overall etching step,
    wherein said overall etching step comprises:
        a fine etching operation close to first and second fronts intended to delimit the first trench, and
        a rough etching operation between the first and second fronts.

2. The method according to claim 1, wherein the rough etching operation is carried out using a laser with a beam wider than the beam used for the fine etching.

3. The method according to claim 1, wherein the fine etching operation is carried out using a femtosecond laser.

4. The method according to claim 3, wherein a wavelength of said femtosecond laser is comprised between 400 and 600 nm.

5. The method according to claim 1, wherein the beam used for the fine etching operation is a circular beam.

6. The method according to claim 1, wherein the rough etching operation is carried out using a picosecond or nanosecond laser.

7. The method according to claim 1, wherein the rough etching operation is carried out using an elliptical beam laser.

8. The method according to claim 1, wherein said fine etching operation is carried out, respectively close to each of the first and second fronts, along a single row of impacts of laser impacts, said laser impacts partially overlapping in the direction of said row running along each of said first and second fronts.

9. The method according to claim 8, wherein said single row of impacts of laser impacts is obtained in several laser etching passes, each pass further hollowing out said row.

10. The method according to claim 1, wherein said rough etching operation is carried out along one or more rows of impacts of laser impacts obtained in a single laser etching pass.

11. The method according to claim 1, wherein the fine etching operation extends over an overall width comprised between 5 and 20% of the width separating the first front from the second front.

12. The method according to claim 1, wherein
    said fine etching operation is carried out with laser impacts forming impacts partially overlapping in a dimension running along each of said first and second fronts, and
    said rough etching operation is carried out with laser impacts forming impacts partially overlapping in the same dimension running along each of said first and second fronts,
        the partial overlapping of the impacts during the fine etching operation being greater than the partial overlapping during the rough etching operation.

13. The method according to claim 1, wherein
    said fine etching operation is carried out with laser impacts forming impacts partially overlapping in two surface dimensions of the first layer and/or of the second layer, and
    said rough etching operation is carried out with laser impacts forming impacts partially overlapping in a single surface dimension of the first layer and/or of the second layer.

14. The method according to claim 13, wherein the fine etching operation extends over an overall width comprised between 20 and 40% of the width separating the first front from the second front.

15. The method according to claim 1, wherein the second trench at least is formed using a Gaussian beam laser.

16. The method according to claim 1, wherein the second trench at least is formed using a femtosecond laser of wavelength comprised between 1000 and 1200 nm.

17. The method according to claim 1, wherein, the first layer being coated with at least one third transparent layer, the method further comprises etching a third trench in the third layer so as to expose the first layer, and wherein the etching of the third trench is carried out using a femtosecond laser, the etching of the first and second trenches is carried out using a nanosecond laser.

18. The method according to claim 1, wherein the first layer, with photovoltaic properties, is based on a material of stoichiometry I-III-VI$_2$.

19. The method according to claim 1, wherein the first layer is coated with at least one third transparent layer, and wherein the first trench at least is formed in the first and the third layer.

* * * * *